United States Patent
Zhang et al.

(10) Patent No.: US 10,714,422 B2
(45) Date of Patent: Jul. 14, 2020

(54) ANTI-FUSE WITH SELF ALIGNED VIA PATTERNING

(71) Applicant: GLOBALFOUNDRIES INC., Grand Cayman (KY)

(72) Inventors: Xiaoqiang Zhang, Clifton Park, NY (US); Guoxiang Ning, Clifton Park, NY (US); Jiehui Shu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/161,590

(22) Filed: Oct. 16, 2018

(65) Prior Publication Data

US 2020/0118927 A1    Apr. 16, 2020

(51) Int. Cl.
*H01L 23/525* (2006.01)
*H01L 21/768* (2006.01)

(52) U.S. Cl.
CPC .... *H01L 23/5252* (2013.01); *H01L 21/76886* (2013.01)

(58) Field of Classification Search
CPC ................. H01L 23/5252; H01L 21/76886
See application file for complete search history.

(56) References Cited

U.S. PATENT DOCUMENTS

| | | | |
|---|---|---|---|
| 5,412,245 A | 5/1995 | Favreau | |
| 5,929,505 A | 7/1999 | Takagi et al. | |
| 5,937,281 A * | 8/1999 | Wu | H01L 23/5252 257/50 |
| 6,087,677 A * | 7/2000 | Wu | H01L 23/5252 257/50 |
| 6,291,352 B1 * | 9/2001 | Woerlee | H01L 21/0332 257/E21.035 |
| 6,465,282 B1 | 10/2002 | Tobben et al. | |
| 2003/0183867 A1 * | 10/2003 | Fricke | H01L 27/101 257/314 |
| 2004/0157442 A1 * | 8/2004 | Cowley | H01L 21/6802 438/687 |
| 2005/0002266 A1 * | 1/2005 | Kanaya | H01L 27/11507 365/232 |
| 2013/0307115 A1 * | 11/2013 | Filippi | H01L 23/5252 257/530 |

* cited by examiner

*Primary Examiner* — Kyoung Lee
*Assistant Examiner* — Christina A Sylvia
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to an anti-fuse with self-aligned via patterning and methods of manufacture. The anti-fuse includes: a lower wiring layer composed of a plurality of lower wiring structures; at least one via structure in direct contact and misaligned with a first wiring structure of the plurality of lower wiring structures and offset from a second wiring structure of the plurality of lower wiring structures; and an upper wiring layer composed of at least one upper wiring structure in direct contact with the at least one via structure.

18 Claims, 3 Drawing Sheets

ANTI-FUSE WITH SELF ALIGNED VIA PATTERNING

FIELD OF THE INVENTION

The present disclosure relates to semiconductor structures and, more particularly, to an anti-fuse with self-aligned via patterning and methods of manufacture.

BACKGROUND

An anti-fuse is an electrical device that performs the opposite function to a fuse. For example, a fuse starts with a low resistance and is designed to permanently break an electrically conductive path (typically when the current through the path exceeds a specified limit); whereas, an anti-fuse starts with a high resistance and is designed to permanently create an electrically conductive path (typically when the voltage across the anti-fuse exceeds a certain level).

Anti-fuses are widely used to permanently program integrated circuits (ICs). For example, certain programmable logic devices (PLDs), such as structured ASICs, use anti-fuse technology to configure logic circuits and create a customized design from a standard IC design. As an illustration, an electrically programmable anti-fuse can be used for electrical chip ID (ECID) and SRAM, and logic circuit repair with redundancy rows/columns (SRAM) or logic blocks.

Anti-fuse PLDs are one time programmable in contrast to other PLDs that are SRAM based and which may be reprogrammed to fix logic bugs or add new functions. Anti-fuse PLDs have advantages over SRAM based PLDs in that like ASICs, they do not need to be configured each time power is applied. Also, circuits built via the anti-fuse's permanent conductive paths may be faster than similar circuits implemented in PLDs using SRAM technology.

SUMMARY

In an aspect of the disclosure, an anti-fuse structure includes: a lower wiring layer composed of a plurality of lower wiring structures; at least one via structure in direct contact and misaligned with a first wiring structure of the plurality of lower wiring structures and offset from a second wiring structure of the plurality of lower wiring structures; and an upper wiring layer composed of at least one upper wiring structure in direct contact with the at least one via structure.

In an aspect of the disclosure, an anti-fuse structure comprises: a plurality of wiring structures embedded in a dielectric material; at least one of via structure embedded in the dielectric material and in direct contact and misaligned respective ones of the plurality of wiring structures; and upper wiring structures embedded in the dielectric material and in direct contact with the at least one via structure.

In an aspect of the disclosure, an anti-fuse structure comprises: at least two lower wiring structures embedded in a dielectric material; at least one via structure embedded in the dielectric material and misaligned with a first wiring structure of the at least two lower wiring structures and at a distance "x" from a second wiring structure of the at least two lower wiring structures, wherein the distance "x" allows dielectric material to break down upon an application of a voltage resulting in an electrical connection between the second wiring structure and the at least one via structure; and at least one upper wiring structure embedded in the dielectric material and in direct contact with the at least one via structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to an anti-fuse with self-aligned via patterning and methods of manufacture. More specifically, the present disclosure describes a via to trench anti-efuse with a self-aligned via and respective processes. Advantageously, the present disclosure provides an anti-fuse without the requirement of any additional masking or patterning steps.

The anti-fuse with self-aligned via patterning of the present disclosure can be manufactured in a number of ways using a number of different tools. In general, though, the methodologies and tools are used to form structures with dimensions in the micrometer and nanometer scale. The methodologies, i.e., technologies, employed to manufacture the anti-fuse with self-aligned via patterning of the present disclosure have been adopted from integrated circuit (IC) technology. For example, the structures are built on wafers and are realized in films of material patterned by photolithographic processes on the top of a wafer. In particular, the fabrication of the anti-fuse with self-aligned via patterning uses three basic building blocks: (i) deposition of thin films of material on a substrate, (ii) applying a patterned mask on top of the films by photolithographic imaging, and (iii) etching the films selectively to the mask.

Figure 1:
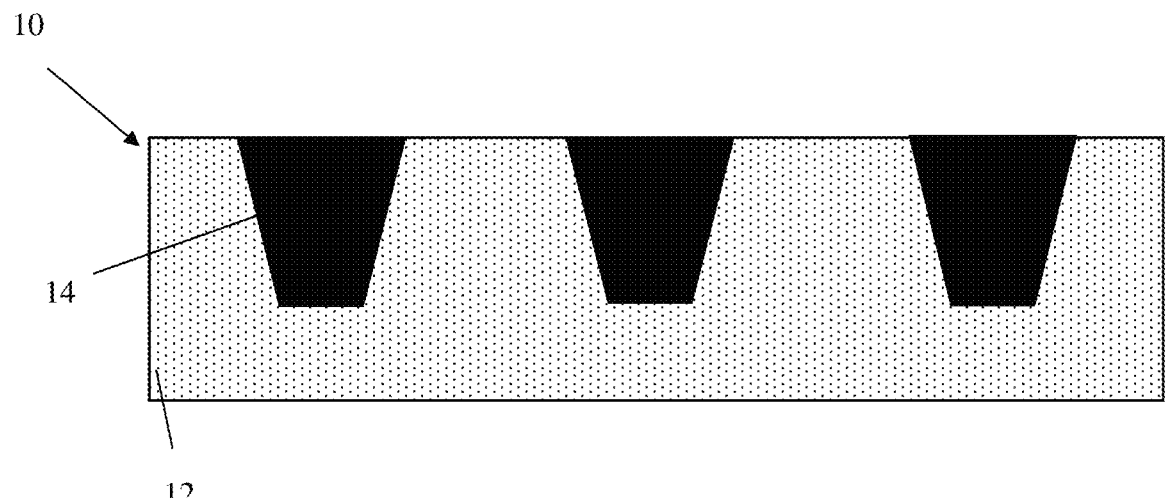
FIG. 1 shows a lower wiring layer, amongst other features, and respective fabrication processes in accordance with aspects of the present disclosure.

FIG. 1 shows a lower wiring layer, amongst other features, and respective fabrication processes in accordance with aspects of the present disclosure. More specifically, the structure 10 of FIG. 1 includes a lower wiring layer composed of a plurality of wiring structures 14 embedded in an insulator material 12. In embodiments, the insulator material 12 can be an oxide or other low-k dielectric material, e.g., $SiO_2$, carbon doped $SiO_2$, SiC, etc.

In embodiments, the plurality of wiring structures 14 can be composed of any appropriate conductive material, e.g., copper, tungsten, cobalt, ruthenium, etc. The plurality of wiring structures 14 can have different dimensions. For example, the plurality of wiring structures 14 can have a width of about 20 nm with a distance separating each of the plurality of wiring structures 14 of about 20 nm; although other dimensions are contemplated herein.

The plurality of wiring structures 14 are fabricated using conventional single damascene processes comprising lithography, etching and deposition methods known to those of skill in the art. For example, a resist formed over the insulator material 12 is exposed to energy (light) to form a pattern (opening). An etching process with a selective chemistry, e.g., reactive ion etching (RIE), will be used to form one or more trenches in the insulator material 12 through the openings of the resist. The resist can then be removed by a conventional oxygen ashing process or other known stripants. Following the resist removal, conductive material is deposited by any conventional deposition processes, e.g., chemical vapor deposition (CVD) processes. Any residual material on the surface of the insulator material 12 can be removed by conventional chemical mechanical polishing (CMP) processes.

Figure 2:
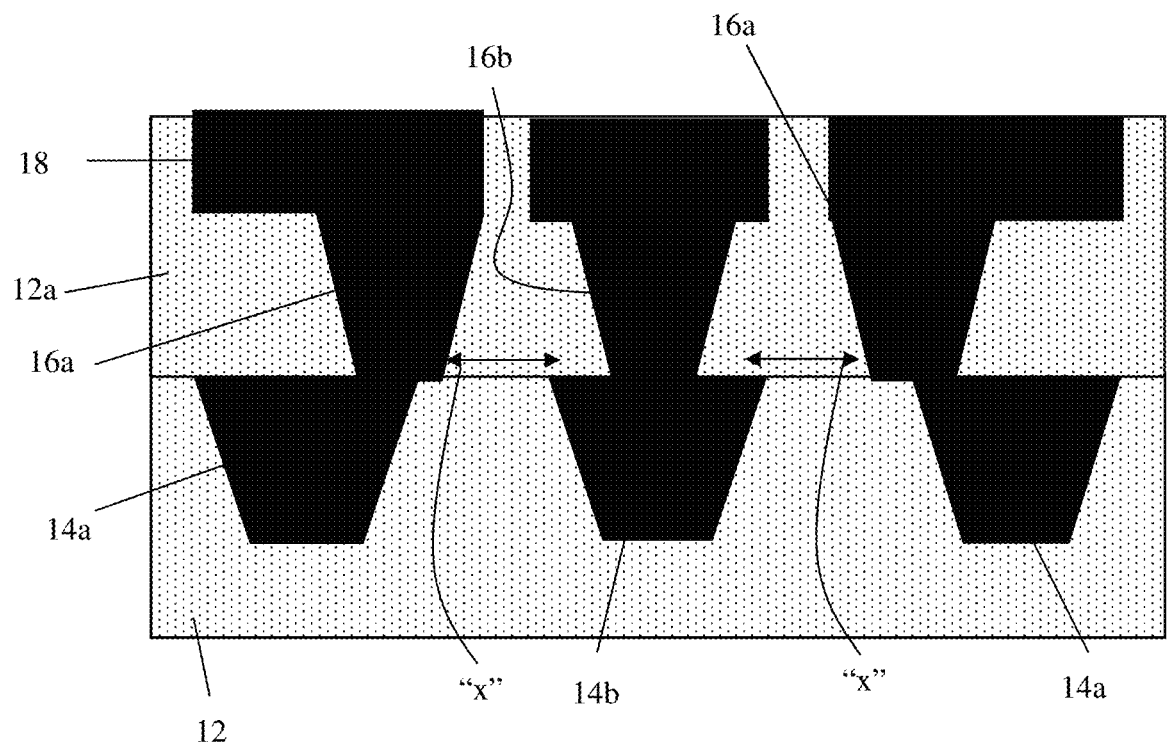
FIG. 2 shows a plurality of via structures and an upper wiring layer, amongst other features, and respective fabrication processes in accordance with aspects of the present disclosure.

FIG. 2 shows a plurality of via structures (e.g., square via, via bar, etc.) 16a, 16b and respective upper wiring structures 18 embedded with an insulator material 12a in accordance with aspects of the present disclosure. In embodiments, the insulator material 12a can be an oxide or other low-k dielectric material, e.g., $SiO_2$, carbon doped $SiO_2$, SiC, etc. In further embodiments, the vias 16 and upper wiring structure 18 can be fabricated using conventional lithography, etching and deposition methods known to those of skill in the art. For example, the vias 16a, 16b and upper wiring structure 18 can be fabricated using a dual damascene process known to those of skill in the art. Alternatively, the vias 16a, 16b and upper wiring structure 18 can be fabricated using two separate single damascene processes known to those of skill in the art. Also, the vias 16a, 16b and upper wiring structure 18 can be composed of any appropriate conductive material, e.g., copper, tungsten, cobalt, ruthenium, etc. The dimensions of the vias 16a, 16b, for example, can be about 10 nm to 30 nm wide; although other dimensions are contemplated herein depending on the particular technology node.

As shown in FIG. 2, the vias 16a are misaligned or offset (left or right) from the plurality of wiring structures 14a. In embodiments, the vias 16a are deliberately misaligned or offset from the plurality of wiring structures 14a of the underlying metal wiring (e.g., lower wiring layer). For example, the vias 16a are deliberately misaligned or offset by about 15 nm to about 25 nm. And, even more specifically, the vias 16a are deliberately misaligned or offset from the plurality of wiring structures 14a such that the vias 16a are located at a distance "x" closer to a respective underlying wiring structure (metal wire) 14b than allowed by predetermined (e.g., conventional) ground rules for a particular technology node. In embodiments, at least one of the vias 16b can be aligned with one of the wiring structures 14b, as an example.

The distance "x" between the wiring structures 14b and each offset via 16a will be about 1 nm to about 3 nm (or other appropriate distance) which is close enough to cause a breakdown of the insulator material 12, 12a therebetween upon application of a current. This breakdown of the insulator material 12, 12a will result in an electrical connection between a respective wiring structure 14b and offset via 16a. In this way, an anti-fuse is created without the requirement of any additional masking or patterning steps.

Figure 3A:
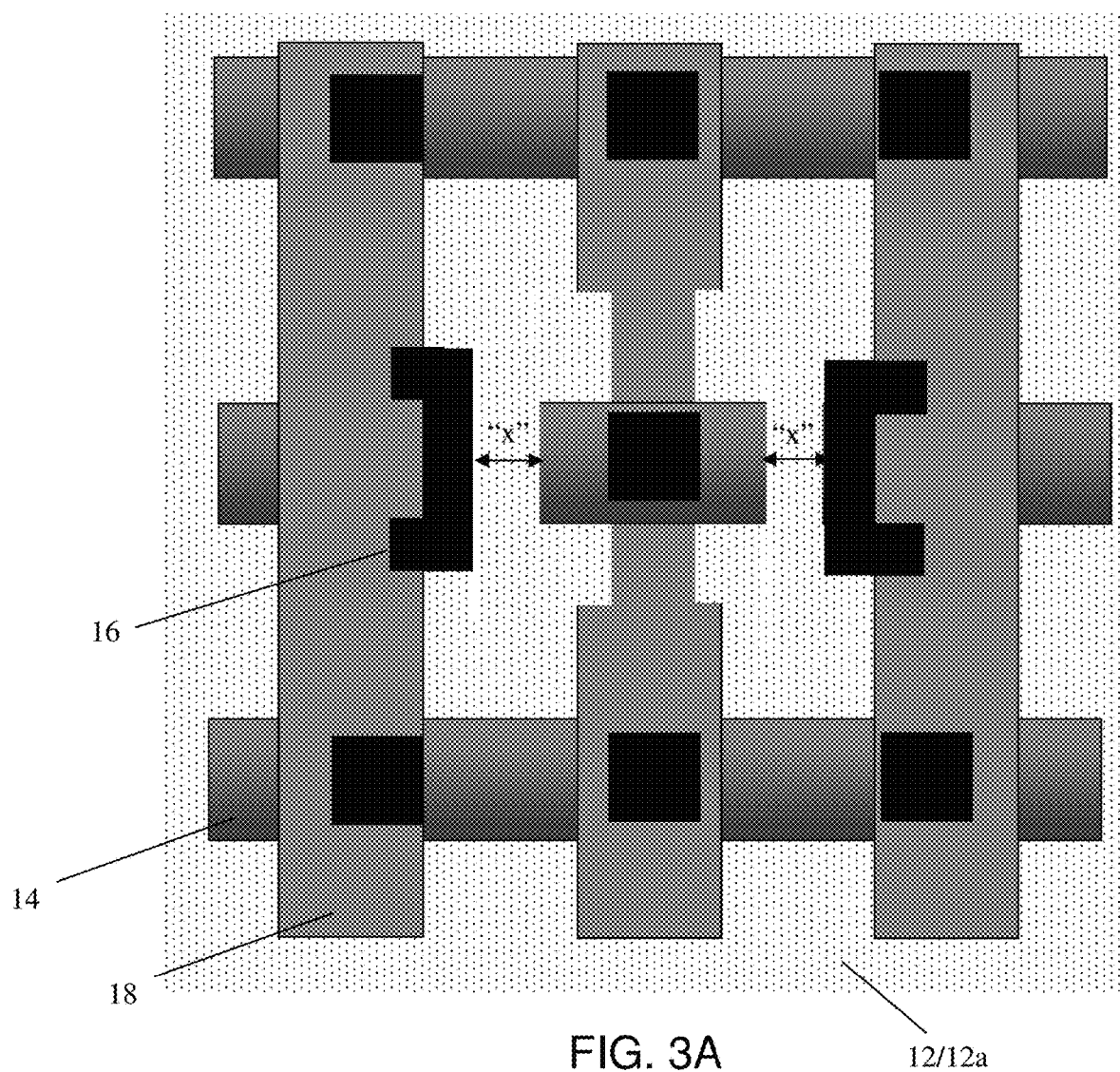
FIG. 3A shows a top view of an alternative structure in accordance with aspects of the present disclosure.
Figure 3B:
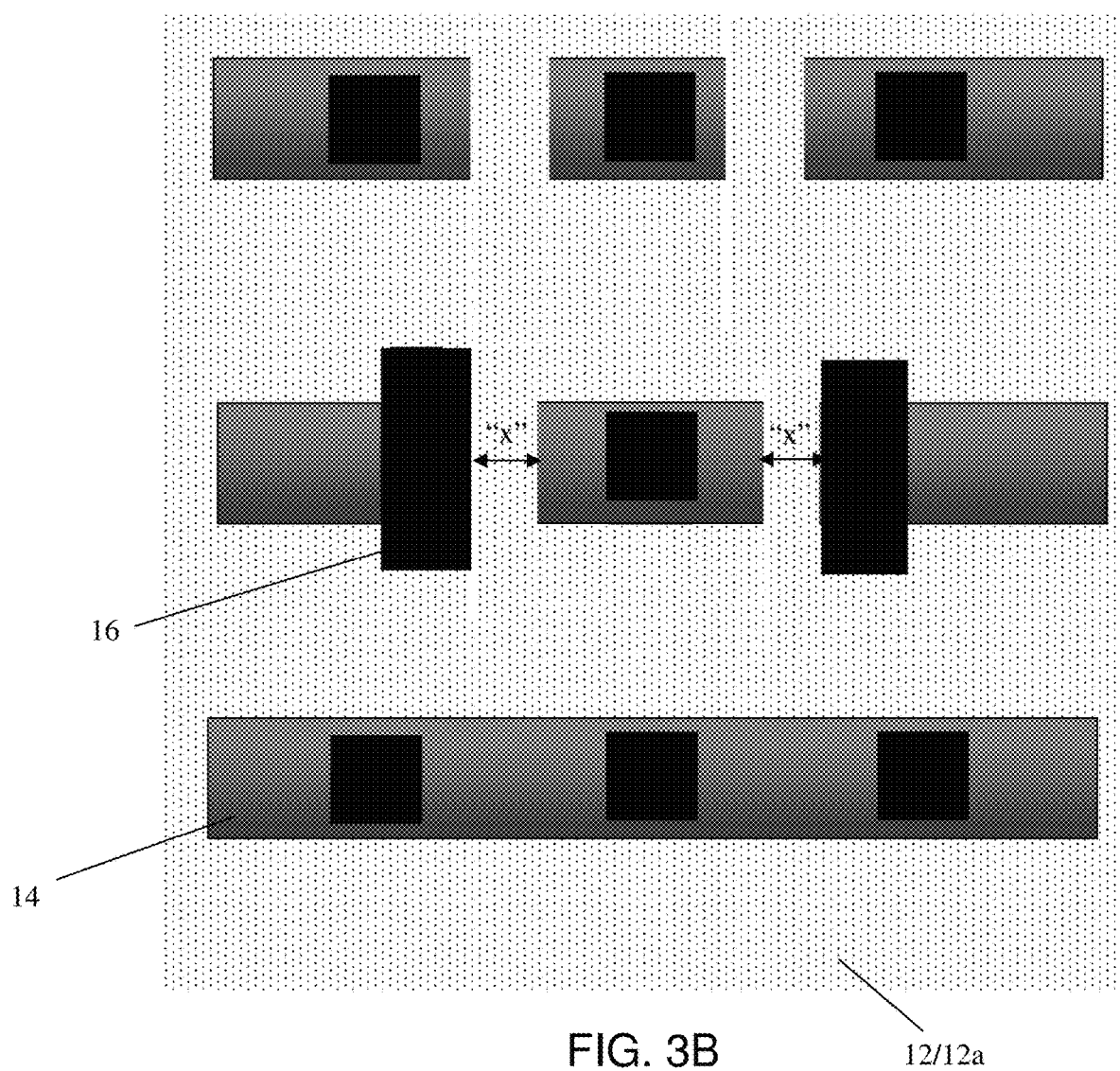
FIG. 3B shows a top view of the alternative view, through a lower wiring cross-section, in accordance with aspects of the present disclosure.

FIGS. 3A and 3B shows different top views of an alternative structure in accordance with aspects of the present disclosure. As shown in the representative structure of FIGS. 3A and 3B, the upper wiring structure can be composed of a plurality of wiring structures 18. The vias (square via, via bar, etc.) 16 can be offset or misaligned from the plurality of wiring structures 14 of the lower wiring layer by a distance of "x". Upon application of a current, the insulator material 12, 12a will breakdown causing an electrical connection between a respective wiring structure 14 and offset via 16.

In embodiments, the insulator material 12, 12a can be $SiO_2$, carbon doped $SiO_2$ or SiC as non-limiting illustrative examples. The properties of these materials are shown in Table 1 below.

TABLE 1

| Material | Dielectric Constant | Critical Field (MV/cm) | Operating Field (MV/cm) | $\varepsilon E_0$ (MV/cm) |
|---|---|---|---|---|
| $SiO_2$ | 3.9 | 11 | 2 | 7.8 |
| SiC | 10 | 3 | 3 | 30 |

The following equation can be used to calculate the voltage needed to blow the anti-fuse (Vblown), i.e., breakdown the insulator material 12, 12a between the offset via 12 and the wiring structure 14.

$$V\text{blown} = E * d (\text{distance}) \quad (1)$$

E is the magnitude of the electric field between plates (offset via and underlying wiring structure), Vblown is the potential difference between the plates, and d is the separation (distance) of the plates.

Using the above equation (1), when the insulator material 12, 12a is $SiO_2$ and the space between the respective wiring structure 14 and offset via 16 is 1 nm, a voltage of 1V is required to breakdown the insulator material 12, 12a. As another example, when then insulator material 12, 12a is $SiO_2$ and the space between the respective wiring structure 14 and offset via 16 is 3 nm, a voltage of 3V is required to breakdown the insulator material 12, 12a.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. An anti-fuse structure comprising:
   a lower wiring layer composed of a plurality of lower wiring structures and embedded in a first insulator layer of dielectric material;

at least one via structure in contact and misaligned with a first wiring structure of the plurality of lower wiring structures and offset from a second wiring structure of the plurality of lower wiring structures; and an upper wiring layer composed of at least one upper wiring structure in contact with the at least one via structure, wherein the at least one via structure and the upper wiring layer are completely embedded in a second insulator layer of the dielectric material contacting an upper surface of the first insulator layer of the dielectric material, with no intervening material therebetween, and wherein the first insulator layer and the second insulator layer are composed of a same dielectric material, and wherein the at least one via structure has a first width dimension and the at least one upper wiring structure has a second width dimension, different from the first width dimension, thereby forming a dual damascene metallization structure with two different width dimensions.

2. The anti-fuse structure of claim 1, wherein the at least one via structure is offset from the second wiring structure by a distance "x" closer than allowed by predetermined ground rules for a particular technology node.

3. The anti-fuse structure of claim 2, wherein the distance "x" is about 1 nm to about 3 nm.

4. The anti-fuse structure of claim 2, wherein the lower wiring layer and the at least one via structure are completely embedded in the dielectric material.

5. The anti-fuse structure of claim 4, wherein the dielectric material is a low-k dielectric material.

6. The anti-fuse structure of claim 5, wherein the low-k dielectric material is $SiO_2$, carbon doped $SiO_2$, or SiC.

7. The anti-fuse structure of claim 4, wherein the distance "x" is such that the dielectric material will break down upon an application of a voltage of about 1V to about 3V.

8. The anti-fuse structure of claim 4, wherein the distance "x" is such that the dielectric material will break down upon an application of a voltage resulting in an electrical connection between the least one upper wiring structure and at least one of the lower wiring structures of the lower wiring layer.

9. The anti-fuse structure of claim 1, wherein:
the at least one via structure is a plurality of via structures in contact, misaligned and offset from a respective one of the plurality of lower wiring structures;
the at least one via structure comprising a first cross-sectional dimension and the second wiring structure comprising a second cross-sectional dimension resulting in the dual damascene metallization structure with two different cross-sectional dimensions, the at least one via structure and the second wiring structure being embedded within the second insulator layer of the dielectric material;
the at least one via structure is offset from the second wiring structure by a distance "x" closer than allowed by predetermined ground rules for a particular technology node;
the dielectric material is a low-k dielectric material composed of $SiO_2$ for both the first insulator layer and the second insulator layer, and
the distance "x" and composition of the dielectric material is such that the dielectric material breaks down upon an application of a voltage of about 1V to about 3V.

10. An anti-fuse structure comprising:
a plurality of wiring structures embedded in a first layer of dielectric material;

at least one of via structure completely embedded in a second layer of the dielectric material which is in contact with the first layer of the dielectric material, and the at least one via structure being in contact and misaligned with respective ones of the plurality of wiring structures; and upper wiring structures embedded in the dielectric material and in contact with the at least one via structure, wherein the first layer and the second layer of dielectric material are composed of a same dielectric material, and wherein the at least one via structure has a first width dimension and the at least one upper wiring structure has a second width dimension, different from the first width dimension, thereby forming a dual damascene metallization structure with two different width dimensions.

11. The anti-fuse structure of claim 10, wherein the at least one via structure is a plurality of via structures.

12. The anti-fuse structure of claim 10, wherein the at least one of the via structures and one of the plurality of wiring structures are misaligned by a distance "x" closer than allowed by predetermined ground rules for a particular technology node.

13. The anti-fuse structure of claim 12, wherein the distance "x" is about 1 nm to about 3 nm.

14. The anti-fuse structure of claim 13, wherein the dielectric material is a low-k dielectric material.

15. The anti-fuse structure of claim 14, wherein the distance "x" is such that the dielectric material will break down upon an application of a voltage of about 1V to about 3V and the at least one of via structure which is in direct contact and misaligned with respective ones of the plurality of wiring structures and an upper wiring structure of the upper wiring structures is the second width dimension and the at least one via structure is the first width dimension, different from the first second width dimension, thereby forming the dual damascene metallization structure with two different cross-sectional dimensions.

16. The anti-fuse structure of claim 14, wherein the distance "x" is such that the dielectric material will break down upon an application of a voltage resulting in an electrical connection between at least one of the plurality of via structures which are offset from at least one of the plurality of wiring structures.

17. An anti-fuse structure comprising:
at least two lower wiring structures embedded in a first layer of dielectric material;
at least one via structure embedded in a second layer of the dielectric material and misaligned with a first wiring structure of the at least two lower wiring structures and at a distance "x" from a second wiring structure of the at least two lower wiring structures, wherein the distance "x" and a composition of the dielectric material is structured and arranged to have dielectric material break down upon an application of a voltage resulting in an electrical connection between the second wiring structure and the at least one via structure; and
at least one upper wiring structure embedded in the second layer of the dielectric material and in direct contact with the at least one via structure, wherein:
the at least one via structure having a first cross-sectional dimension and the at least one upper wiring structure having a second cross-sectional dimension resulting in a dual damascene structure which is completely embedded within the second layer of the dielectric material, the first layer of the dielectric material is in direct contact with the second layer of the dielectric material without any intervening insulator material therebetween, the dielectric material of the first layer and the second layer is a low-k dielectric material composed of $SiO_2$, the distance "x" is about 1 nm to about 3 nm, and the distance "x" is such that the dielectric material will break down upon the application of the voltage of about 1V to about 3V.

18. The anti-fuse structure of claim 17, wherein the first cross-sectional dimension is a first width dimension and the second cross-sectional dimension is a second width dimension, different from the first width dimension.

* * * * *